United States Patent [19]

Whiteman, Jr.

[11] Patent Number: 4,756,696
[45] Date of Patent: Jul. 12, 1988

[54] SOLDER JOINT INSPECTION FEATURE FOR SURFACE MOUNT CONNECTORS

[75] Inventor: Robert N. Whiteman, Jr., Middletown, Pa.

[73] Assignee: AMP Incorporated, Harrisburg, Pa.

[21] Appl. No.: 11,560

[22] Filed: Feb. 6, 1987

Related U.S. Application Data

[63] Continuation-in-part of Ser. No. 806,141, Dec. 6, 1985, Pat. No. 4,660,911.

[51] Int. Cl.⁴ ............................................. H01R 23/72
[52] U.S. Cl. ................................. 439/79; 228/103; 228/180.2
[58] Field of Search ............... 29/839, 840, 843; 228/103, 104, 105, 179, 180.1, 180.2, 56.5, 79–83; 439/876

[56] References Cited

U.S. PATENT DOCUMENTS

| | | | |
|---|---|---|---|
| 2,902,629 | 9/1959 | Little et al. | 361/405 |
| 3,245,024 | 4/1966 | Evans | 439/67 |
| 3,451,122 | 6/1969 | Kuhns et al. | 29/843 |
| 3,493,916 | 2/1970 | Hansen | 439/79 |
| 3,697,933 | 10/1972 | Black et al. | 439/686 |
| 3,889,364 | 6/1975 | Krueger | 228/179 |
| 4,425,015 | 1/1984 | Rizzo | 439/83 |
| 4,439,000 | 3/1984 | Kaufman et al. | 439/637 |
| 4,491,376 | 1/1985 | Gladd et al. | 439/660 |
| 4,583,807 | 4/1986 | Kaufman et al. | 439/83 |
| 4,628,410 | 12/1986 | Goodman et al. | 361/413 |
| 4,660,911 | 4/1987 | Reynolds et al. | 439/83 |
| 4,672,739 | 1/1987 | Churchwell et al. | 29/843 |

FOREIGN PATENT DOCUMENTS

| | | | |
|---|---|---|---|
| 38-15471 | 8/1963 | Japan | 228/179 |
| 8203380 | 10/1982 | World Int. Prop. O. | |

OTHER PUBLICATIONS

IBM Bulletin, vol. 29, No. 4, p. 1612, 9–1986.
Electronics, 11-3-1981, Sized Solder Bumps Make Solid Joints, p. 46.
Cleveland Electrical/Electronics Conference Digest, Vanzetti, p. 103, 5-20-1980.

Primary Examiner—Neil Abrams
Attorney, Agent, or Firm—David L. Smith

[57] ABSTRACT

A solder joint inspection feature (86) for evaluating the solder joint (88) securing a contact solder tail (58) of a surface mount connector to a printed circuit board (2). A solder joint inspection feature (86) is incorporated in the solder tail (58) of contacts (40) in a surface mount electrical connector a predetermined distance from the end. When the solder tails (58) are soldered, such as to traces (4) on a printed circuit board (2), an acceptable solder fillet (88a) will cover the inspection feature and thus the inspection feature (86) will not be visible. If the distal end (61) of the solder tail (58) is not close enough to the trace or if the fillet is formed with insufficient solder, the solder joint (88b) is unacceptable as indicated by the visible solder joint inspection feature (86).

17 Claims, 6 Drawing Sheets

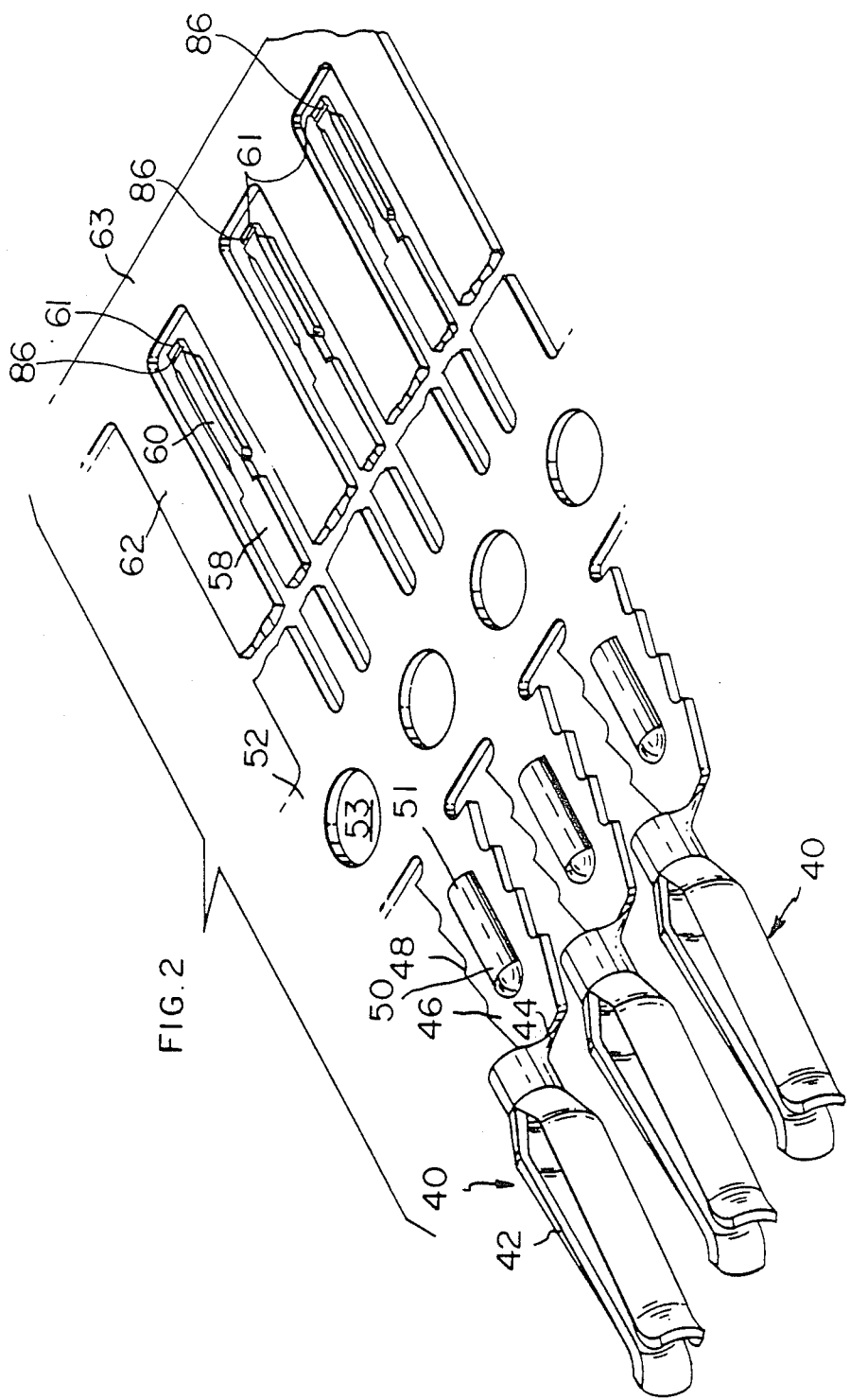

4,756,696

SOLDER JOINT INSPECTION FEATURE FOR SURFACE MOUNT CONNECTORS

CROSS REFERENCE TO RELATED APPLICATION

This application is a continuation-in-part application of Application Ser. No. 806,141 filed Dec. 6, 1985, now U.S. Pat. No. 4,660,911.

BACKGROUND OF THE INVENTION

This invention relates to surface mount connectors and in particular to a solder joint inspection feature for evaluating whether sufficient solder is present in a solder joint securing a contact solder tail to land on a printed circuit board.

The electrical connections between a surface mount connector and land on a printed circuit board are typically soldered. To compensate for warpage as well as to allow for differential expansion between the circuit board and the connector without stressing the solder joints, the electrical terminals in a surface mount connector are not constrained but move vertically and laterally. Typically each terminal is biased against the connector housing to assure compliance of the distal end of a solder tail with land on the printed circuit board.

Due to board warpage and other factors, the distal end of the solder tail does not always compliantly engage land on the printed circuit board, or a solder joint is formed with insufficient solder. Either of these conditions result in an unacceptable solder joint between the connector and printed circuit board.

SUMMARY OF THE INVENTION

In accordance with the invention, a solder joint inspection feature is incorporated in the solder tail or contacts a predetermined distance from the distal end thereof. Although the preferred embodiment is described with respect to a surface mount connector, the invention is not limited thereto as the invention may be used with other connectors having contacts passing through plated through holes. The inspection feature is used as a visual indication that a sufficient amount of solder is present in the solder fillet when the solder tails are soldered such as to land on a printed circuit board.

BRIEF DESCRIPTION OF THE DRAWINGS

FIG. 2 is a perspective view of a progression of contacts during manufacture of contacts incorporating the inspection feature;

DETAILED DESCRIPTION OF THE PREFERRED EMBODIMENT

Figure 1:
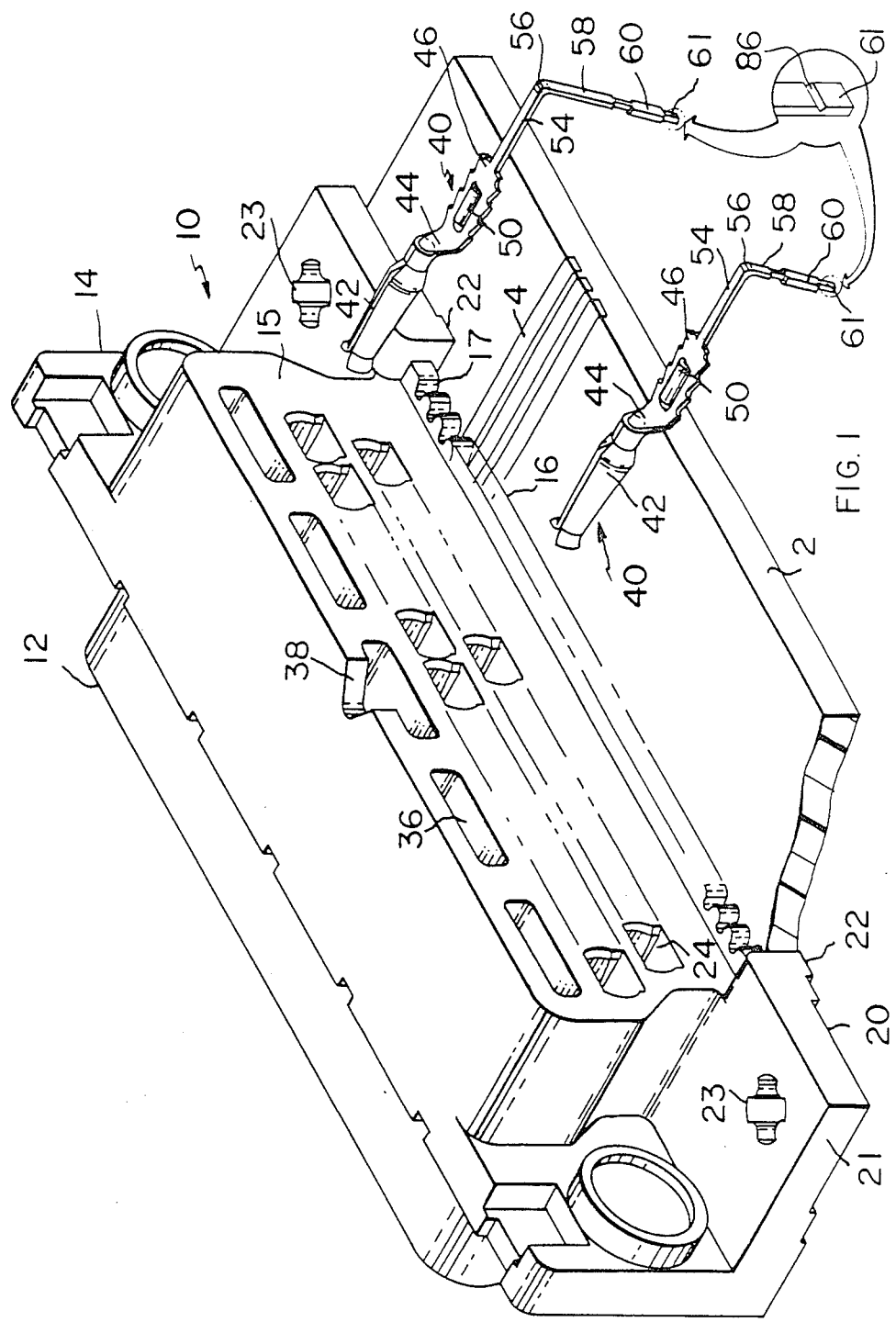
FIG. 1 is a perspective of a connector housing with contacts embodying the solder joint inspection feature exploded therefrom.

Referring to FIG. 1, housing 10 has a mating face 12 surrounded by mating flange 14, an opposed rear face 15, and a mounting face 20 having stand-offs 22 which are secured to circuit board 2 by hardware received through holes 23 in mounting flanges 21. The holes 23 are profiled with bumps to snugly accommodate a rivet regardless of diameter variations within manufacturing tolerance, thus acting as a precision aligning feature. The housing 10 is injection molded of high temperature plastic with parallel rows of contact receiving passages 24 extending between faces 12, 15. A rib 16 extends across the rear face 15 below passages 24, the rib 16 having channels 17 spaced the same distance apart as the centerline spacing of the passages 24. Core holes 36 conserve material and assure uniform cooling of the plastic after molding. Notch 38 facilitates robotic handling and positioning of the connector.

Typical stamped and formed metal contacts 40 each have a socket 42 and a retaining plate 46 which are received in a respective passage 24, the plate 46 being stepped down from socket 42 through neck 44.

Retentions means are formed on plate 46. The retention means shown are scalloped edges 48 terminating in barbs 72. The tapered shape of edges 48 facilitate insertion of a terminal 40 into a passage 42. Upon insertion, barbs 72 which extend beyond the distance between sidewalls 32 in passage 24 plow through the housing plastic forming sidewalls 32 and the plastic flows around barbs 72 for retention of contact 40 in passage 24 by an interference fit.

Insertion feature 50 substantially transfers the insertion force applied to vertical surface 51 to be coplanar with the resistance to insertion of contact 40 in passage 24 introduced by scalloped edges 48.

Behind plate 46 a cantilever arm 54 extends to a bend 56, which is formed through 105 degrees from the plane of the strip stock. A solder tail 58 extends from bend 56 to distal end 61 which is received against an electrically conductive solder pad or land 4 on printed circuit board 2. The solder tails 58 of the contacts 40 received in the lower row of passages 24 are shorter than the solder tails of the contacts received in the upper row of passages. Each tail 58 is formed with a portion 60 of generally V-shaped cross section which is received in a respective channel 17.

Referring also to FIG. 2, socket contacts 40 in strip form are stamped and formed either on centerline or on a multiple thereof. The carrier strip 52 is located intermediate opposite ends of the contact and has partitions 62 extending between solder tails 58 and attaching to tail strip 63 adjacent distal ends 61. This arrangement permits plating ends 61 but leaves them protected against damage during handling. The contact strip shown is intended for the top row of passages 24; for other rows, tails 58 would be shorter.

Figure 4A:
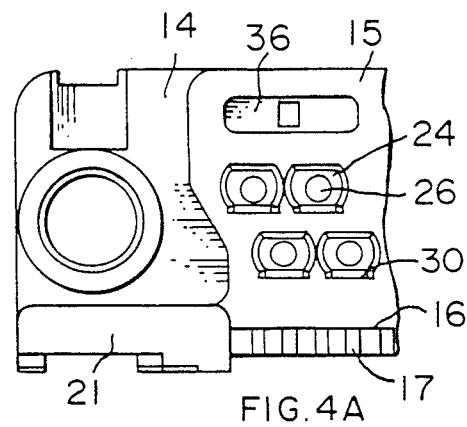
FIG. 4A is a rear view of the housing.
Figure 4B:
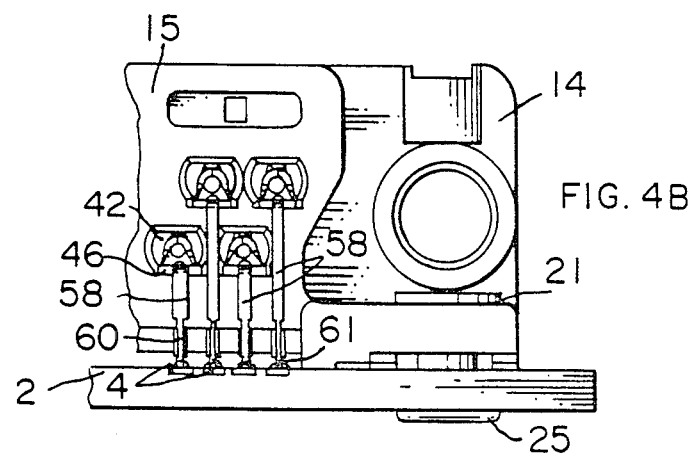
FIG. 4B is a rear view of the housing loaded with contacts and assembled to a printed circuit board.
Figure 5A:
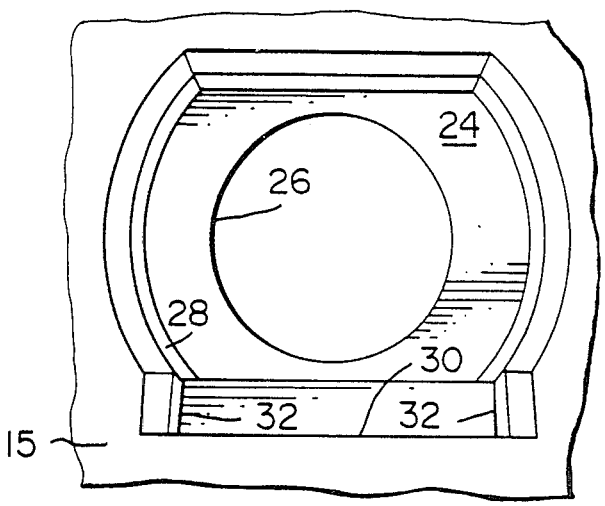
FIG. 5A is an enlarged rear view of a contact passage.
Figure 5B:
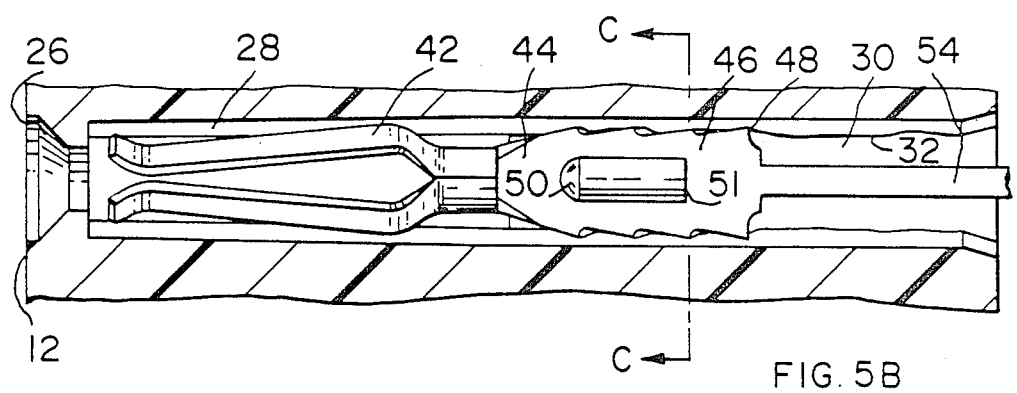
FIG. 5B is an enlarged plan section of the contact retention feature.
Figure 5C:
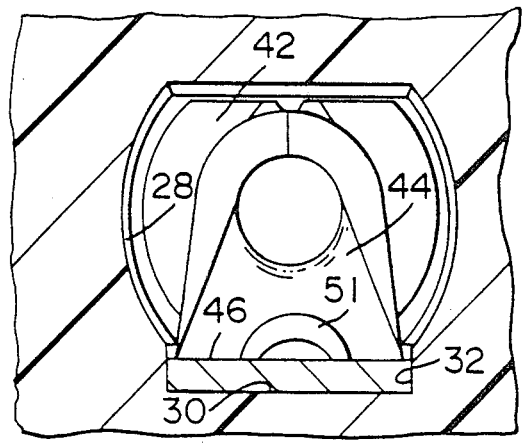
FIG. 5C is an enlarged rear section of the retention feature, taken along line C—C of FIG. 5B.

Referring to FIGS. 4A and 5A, each passage 24 consists of an upper portion 28 having arcuate sidewalls which converge toward pin-receiving lead-in 26, and a subfloor 30 toward rear face 15, the subfloor 30 being flanked by sidewalls 32 which likewise converge, and have a dovetail profile to urge plate 46 against subfloor 30 (FIG. 5C). FIG. 4B shows contacts 40 assembled to housing 10, the V-shaped portions 60 on solder tails 58 being received in respective channels 17 at half of the centerline spacing of passages 24 as there are two rows of passages 24, which corresponds to the spacing of traces 4 on board 2. Mounting hardware in the form of rivet 25 as shown in FIG. 4B is used to attach the housing 10 to board 2 prior to soldering tails 58 to land 4.

To assemble the contacts 40 into housing 10, a "comb" of contacts corresponding to the number of passages 24 in a row or a portion thereof, in accordance with known techniques, is severed from the continuous strip, and the tails 58 are formed through approximately 105 degrees at a predetermined distance from vertical surface 51. The sockets 42 are then partially inserted en masse into the row of passages 24, and the carrier strip 52 is blanked off along shear lines between indexing holes 53. The sockets 42 of contacts 40 are then fully inserted into passage 24 by pushing against the vertical surfaces 51 of insertion feature 50.

FIGS. 5B and 5C show the socket 42 fully inserted in upper passage portion 28, the plate 46 being received flushly against subfloor 30 with scalloped edge surfaces 48 received in interference between sidewalls 32. The plastic conforms to the profile of edge surfaces 48 to prevent axial withdrawal and also flows onto the rolled surface of plate 46 to prevent upward movement.

Figure 6A:
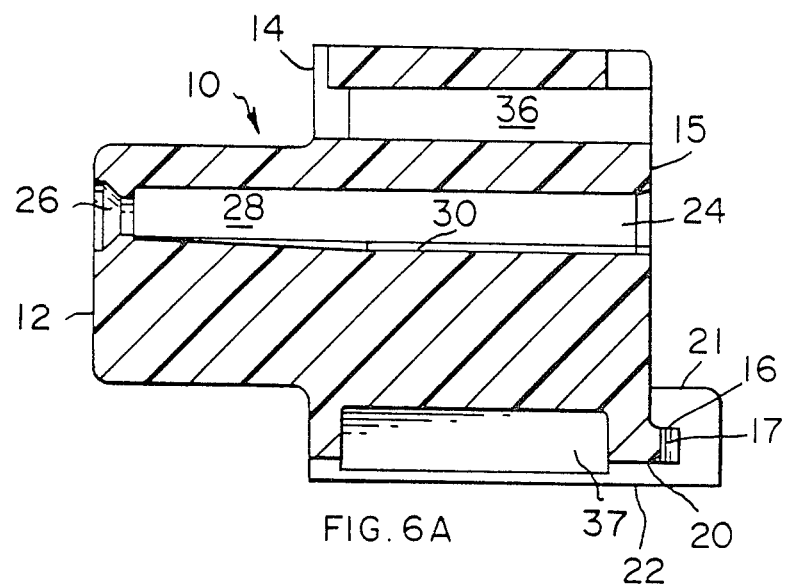
FIG. 6A is a side section of the housing.
Figure 6B:
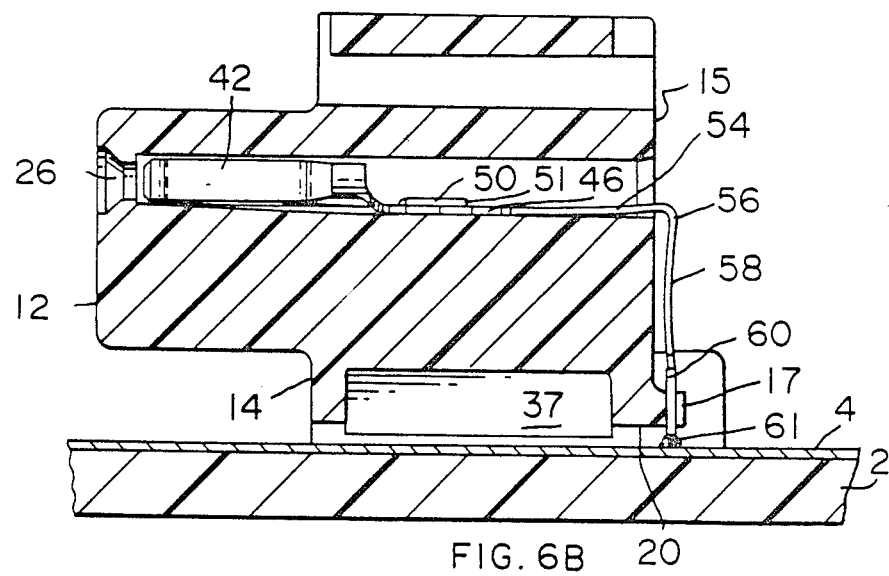
FIG. 6B is a side section of the housing loaded with terminals and assembled to a printed circuit board.

FIGS. 6A and 6B are side section corresponding to FIGS. 4A and 4B, taken through one of the passages 24 in the upper row. Bottom recesses 37, like the cored passage 36, is provided to assure uniform cooling of the plastic after molding. Since the plate 46 is received between sidewalls 32 in interference, it provides the anchoring point for each cantilever arm 54 and thus permits upward bending to assure compliance of distal ends 61 with respective land 4 on printed circuit board 2. The rib 16 and channels 17 therein are located along the edge of mounting face 20. Since only stand-offs 22 on end flanges 21 separate the rib 16 from the board 2, this assures that distal ends 61 will be spaced as channels 17 and likewise as land 4. At the same time, the stand-offs 22 allow room for solder joints formed by reflowing solder on land 4. The distal ends 61 are arranged in a single exposed row which can readily be soldered by radiant or other line-of-sight heat source, as well as vapor phase soldering.

The single exposed row also permits inspection of the solder joints 88. Inspection feature 86 is incorporated in solder tail 58 near the end thereof during manufacture of contact 40. Solder tail 58 in the region of inspection feature 86 has a multiple sided cross section. Since all of the solder tails in the preferred embodiment are formed along rear face 15 with only one side of solder tails 58 visible from the rear of the housing, inspection feature 86 is formed in one side of solder tails 58. In other housing and contact configurations inspection feature 86 may be formed in other or more than a single side of solder tail 58.

Inspection feature 86 may take various forms. In the preferred embodiment, inspection feature 86 is a score line or indentation made in solder tail 58 such as during manufacturing of contact 40.

Inspection feature 86 is placed a predetermined distance from the end of solder tail 58 which places inspection feature 86 a predetermined distance from land 4. For a butt joint with the solder tail substantially normal to printed circuit board 2 as shown in the preferred embodiment the predetermined distance between inspection feature 86 and the end of solder tail 58 is the same as the predetermined distance between inspection feature 86 and land 4 when solder tail 58 engages land 4. When the joint is not a butt joint or when the solder tail is not normal to the printed circuit board, the two predetermined distances may not be identical.

Figure 3A:
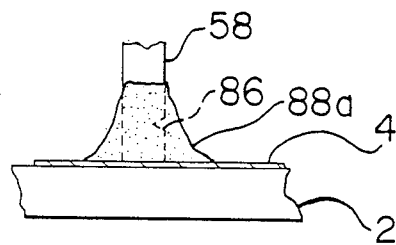
FIG. 3A is an enlarged partial side view of a contact and solder fillet showing acceptable solder joint.

Absent inspection feature 86, it is difficult to determine how far into fillet 88 solder tail 58 extends for a butt joint although it would be less difficult for other types of joints. When the end of solder tail 58 engages land 4 on circuit board 2 or is sufficiently close to assure a good solder joint such as within a few thousandths of an inch and sufficient solder forms a fillet 88 around solder tail 58, inspection feature 58 is engulfed in the solder and is therefore not visible as shown in FIG. 3A. Inspection feature 58 being engulfed in solder is indicative that there is sufficient solder forming solder joint 88 and that solder tail 58 is adequately seated against land 4 on printed circuit board 2. In a preferred embodiment, inspection feature 86 is approximately 0.015 inch (0.38 mm) from the end of solder tail 58.

Figure 3B:
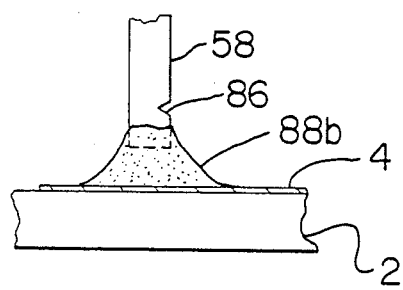
FIGS. 3B and 3C are enlarged partial side views of a contact and solder fillet showing unacceptable solder joints.
Figure 3C:
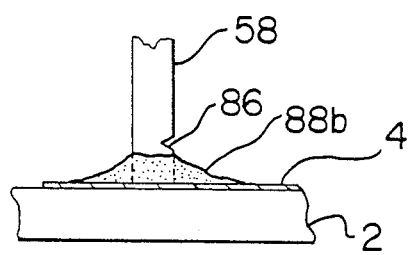

If the end of solder tail 58 is not close enough to trace 4 during soldering, as may occur where board 2 is warped, an unacceptable solder joint 88b is formed as illustrated in FIG. 3B. Similarly when the solder fillet contains sufficient solder, even though solder tail 58 is seated against printed circuit board 2, an unacceptable solder joint 88b is formed as illustrated in FIG. 3C. An unacceptable solder joint is detected by visual inspection revealing that solder joint inspection feature 86 is visible.

I claim:

1. An electrical connector assembly for mounting on a printed circuit board and for electrically interconnecting to traces on the printed circuit board, comprising:
   an insulative housing having terminal receiving passages extending therethrough; and
   each of said passages having an electrical terminal disposed therein, said terminal having a mating section and a solder tail, said solder tail having a distal end, said solder tail having a solder joint inspection feature located a predetermined distance from the distal end thereof, whereby when the connector assembly is soldered to traces on the printed circuit board forming solder joints between the solder tails and traces a solder joint inspection feature that is engulfed in solder is indicative that there is sufficient solder forming the solder joint and that the solder tail is adequately seated against traces on the printed circuit board, whereas a solder joint inspection feature that is not engulfed in solder is indicative that either the solder joint is formed of insufficient solder or the solder tail is not sufficiently close to the traces.

2. An electrical connector assembly as recited in claim 1 wherein the connector assembly is adapted for surface mounting.

3. An electrical connector assembly as recited in claim 1 wherein the solder tail is substantially perpendicular to the mating portion of the terminal.

4. An electrical connector assembly as recited in claim 1 wherein the predetermined distance from the distal end of the solder tail to the solder joint inspection feature is approximately 0.015 inch (0.38 mm).

5. An electrical connector assembly as recited in claim 1 wherein the distance from the distal end of the solder tail to the solder joint inspection feature is the same as the distance from a trace on the printed circuit board to the solder joint inspection feature when the distal end of the solder tail engages the trace, whereby the solder tail is substantially perpendicular to the trace.

6. An electrical connector assembly as recited in claim 1 wherein the solder joint inspection feature is a score line in the solder tail.

7. An electrical connector assembly as recited in claim 6 wherein the solder tail in the region of the inspection feature has a multiple sided cross section and the inspection feature is in only one of the multiple sides.

8. An electrical terminal for insertion into a terminal receiving passage in a dielectric housing of an electrical connector for surface mounting on a printed circuit board and for electrically interconnecting to traces on the printed circuit board, comprising:

an electrical terminal having a mating section and a solder tail, said solder tail having a distal end remote from the mating section, said solder tail having a solder joint inspection feature a predetermined distance from the distal end thereof, whereby when the terminal is inserted in a terminmal receiving passage of the electrical connector housing and the connector is soldered to traces on the printed circuit board forming solder joints between the distal end and traces a solder joint inspection feature that is engulfed in solder is indicative that there is sufficient solder forming the solder joint and that the solder tail is adequately seated against traces on the printed circuit board, whereas a solder joint inspection feature that is not engulfed in solder solder is indicative that either the solder joint is formed of insufficient solder or the solder tail is not sufficiently close to the traces.

9. The electrical terminal as recited in claim 8 wherein the solder tail is substantially perpendicular to the mating portion of the terminal.

10. An electrical terminal as recited in claim 8 wherein the predetermined distance from the distal end of the solder tail to the solder joint inspection feature is approximately 0.015 inch (0.38 mm).

11. An electrical terminal as recited in claim 8 wherein the solder joint inspection feature is a score line in the solder tail.

12. An electrical terminal as recited in claim 11 wherein the solder tail in the region of the inspection feature has a multiple sided cross section and the inspection feature is in only one of the multiple sides.

13. A connector assembly for mounting to a printed circuit board and for electrically interconnecting to traces thereon, comprising:

a housing having a mating face, an opposed rear face, a mounting face perpendicular to the mating face and the rear face;

a plurality of electrical contacts, each having a mating portion, a solder tail substantially perpendicular thereto, and a bend therebetween, the mating portion being received in a respective passage from the rear face, the solder tails being received proximate the rear face and generally parallel thereto, the solder tails having distal ends proximate the mounting face for disposition against the circuit board;

a rib extending across the rear face of the housing parallel channels with generally V-shaped configuration, a portion of each solder tail having an arcuate surface being disposed resiliently against a respective channel, the channels having a larger width than the solder tails, a solder joint inspection feature on said solder tail, said solder joint inspection feature located a predetermined distance from the distal end thereof, whereby when the connector assembly is soldered to the printed circuit board forming solder joints between the distal ends and traces a solder joint inspection feature that is engulfed in solder is indicative that there is sufficient solder forming the solder joint and that the solder tail is adequately seated against traces on the printed circuit board, whereas a solder joint inspection feature that is not engulfed in solder solder is indicative that either the solder joint is formed of insufficient solder or the solder tail is not sufficiently close to the traces.

14. An electrical connector assembly as recited in claim 13 wherein the predetermined distance from the distal end of the solder tail to the solder joint inspection feature is approximately 0.015 inch (0.38 mm).

15. An electrical connector assembly as recited in claim 13 wherein the distance from the distal end of the solder tail to the solder joint inspection feature is the same as the distance from a trace on the printed circuit board to the solder joint inspection feature when the distal end of the solder tail engages the trace.

16. An electrical connector assembly as recited in claim 13 wherein the solder joint inspection feature is a score line in the solder tail.

17. An electrical connector assembly as recited in claim 16 wherein the solder tail in the region of the inspection feature has a multiple sided cross section and the inspection feature is in only one of the multiple sides.

* * * * *